(12) United States Patent
Lim et al.

(10) Patent No.: US 9,407,476 B2
(45) Date of Patent: Aug. 2, 2016

(54) APPARATUS AND METHOD FOR POWER AMPLIFICATION

(71) Applicant: Samsung Electronics Co., Ltd., Suwon-si, Gyeonggi-do (KR)

(72) Inventors: Chae-Man Lim, Seoul (KR); Byung-Wook Yoo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/494,039

(22) Filed: Sep. 23, 2014

(65) Prior Publication Data

US 2015/0098523 A1 Apr. 9, 2015

(30) Foreign Application Priority Data

Oct. 4, 2013 (KR) ........................ 10-2013-0118661

(51) Int. Cl.

| | |
|---|---|
| *H04L 25/06* | (2006.01) |
| *H04L 25/03* | (2006.01) |
| *H04W 52/02* | (2009.01) |
| *H04L 25/08* | (2006.01) |
| *H03F 1/02* | (2006.01) |
| *H03F 3/189* | (2006.01) |
| *H03F 3/24* | (2006.01) |

(52) U.S. Cl.
CPC .............. *H04L 25/06* (2013.01); *H03F 1/0222* (2013.01); *H03F 1/0227* (2013.01); *H03F 3/189* (2013.01); *H03F 3/24* (2013.01); *H04L 25/03828* (2013.01); *H04L 25/08* (2013.01); *H03F 2200/102* (2013.01); *H03F 2200/27* (2013.01); *H03F 2200/432* (2013.01); *H03F 2200/451* (2013.01)

(58) Field of Classification Search
CPC ................... H03F 2200/102; H03F 2200/451; H03F 2200/27
See application file for complete search history.

(56) References Cited

U.S. PATENT DOCUMENTS

| | | | |
|---|---|---|---|
| 6,900,697 B1 * | 5/2005 | Doyle et al. .................. | 330/297 |
| 8,917,140 B2 | 12/2014 | Baek et al. | |
| 2005/0064830 A1 * | 3/2005 | Grigore ...................... | 455/127.4 |
| 2007/0210771 A1 | 9/2007 | Wilson et al. | |
| 2008/0080640 A1 * | 4/2008 | Rofougaran .................. | 375/297 |
| 2012/0098596 A1 * | 4/2012 | Nagatani et al. .............. | 330/149 |
| 2013/0027129 A1 * | 1/2013 | Langer ......................... | 330/127 |
| 2013/0222062 A1 * | 8/2013 | Park et al. ..................... | 330/251 |
| 2015/0017931 A1 * | 1/2015 | Devison et al. ................ | 455/95 |

FOREIGN PATENT DOCUMENTS

KR    10-2013-0040633 A    4/2013

* cited by examiner

*Primary Examiner* — Ross Varndell
(74) *Attorney, Agent, or Firm* — Jefferson IP Law, LLP

(57) ABSTRACT

A power amplifying apparatus and a method for effectively controlling a bias voltage of a power amplifier are provided. An electronic device includes a baseband signal processor configured to convert a baseband signal to an envelope signal, a power amplifier configured to amplify a Radio Frequency (RF) signal based on the baseband signal, a power modulator configured to modulate an input voltage to a bias voltage of the power amplifier based on the envelope signal, and a power controller configured to control an operation of the power modulator according to a characteristic of the baseband signal.

18 Claims, 12 Drawing Sheets

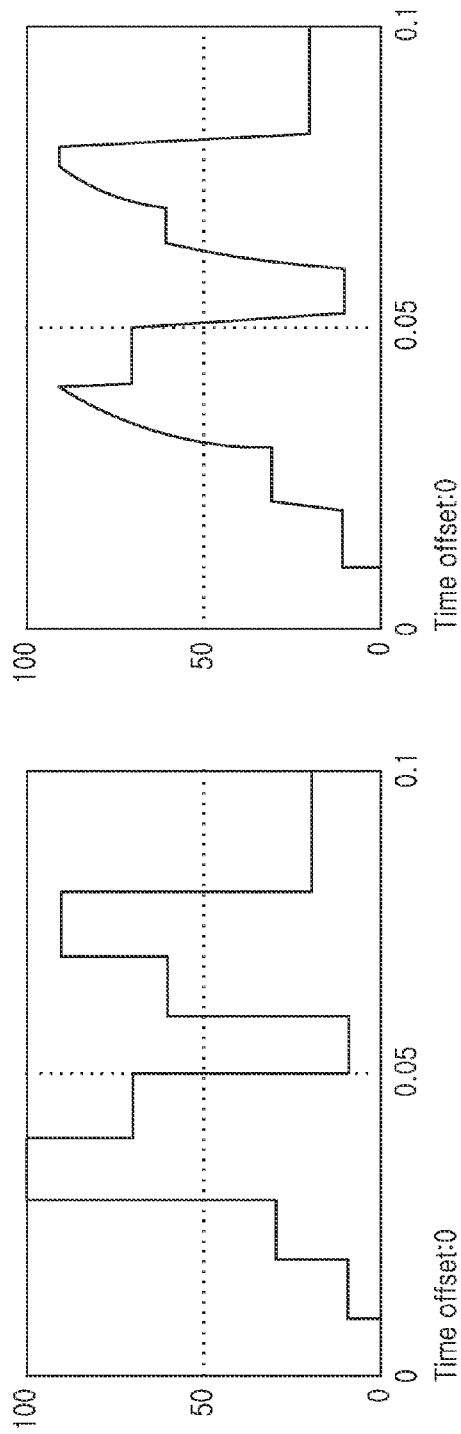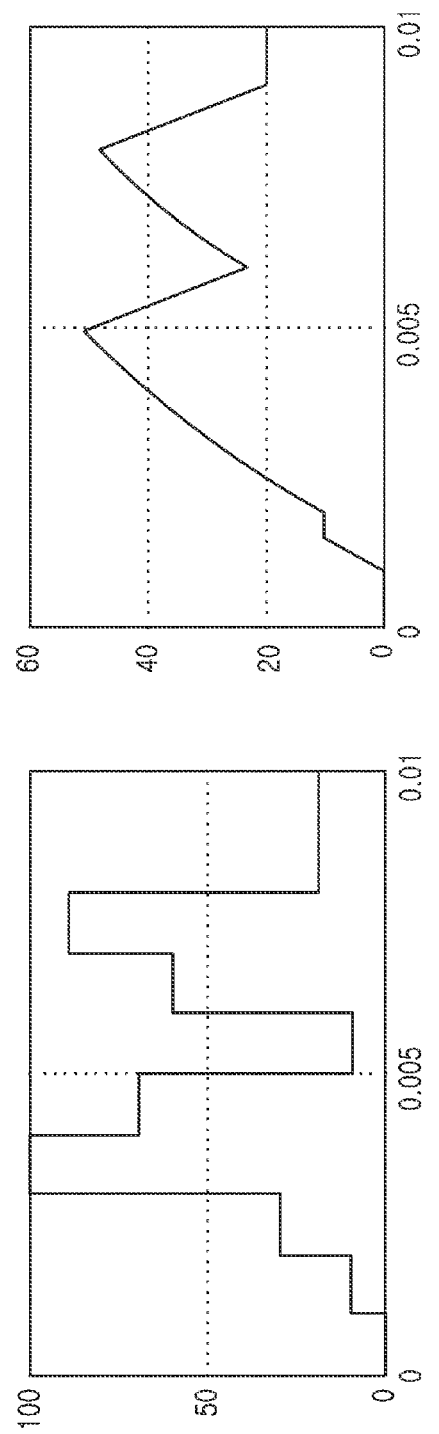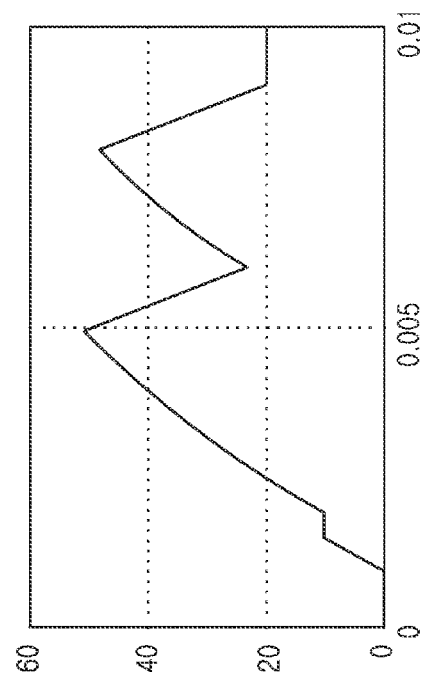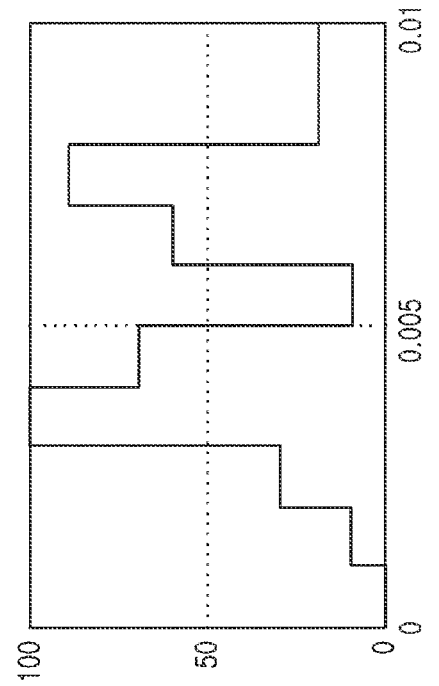

APPARATUS AND METHOD FOR POWER AMPLIFICATION

CROSS-REFERENCE TO RELATED APPLICATION(S)

This application claims the benefit under 35 U.S.C. §119(a) of a Korean patent application filed on Oct. 4, 2013 in the Korean Intellectual Property Office and assigned Serial number 10-2013-0118661, the entire disclosure of which is hereby incorporated by reference.

TECHNICAL FIELD

The present disclosure relates to a power amplifier. More particularly, the present disclosure relates to a power amplifying apparatus and method for effectively controlling a bias voltage of the power amplifier.

BACKGROUND

A wireless communication system primarily uses a digital modulation scheme to more effectively use a limited frequency resource. A digital modulated signal may be subjected to a signal amplifying operation using a Radio Frequency (RF) power amplifier according to its usage, so that an amplified signal is delivered to an antenna.

A multi-carrier transmission scheme or a multi-dimensional modulation scheme may be used to concurrently transmit a great amount of information according to a user demand for high-speed and large-size data processing.

The RF power amplifier uses a battery power in an electronic device (e.g., a portable terminal) as a bias voltage. Thus, battery consumption caused by the RF power amplifier may be greater. Accordingly, a transmitter of the wireless communication system requires a power amplifier having a high-linear and high-efficiency characteristic. As an example of the power amplifier having the high-linear and high-efficiency characteristic, a power amplifier with a structure of Envelope Tracking (ET) and Envelope Elimination Restoration (EER) is used in general.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a power amplifying apparatus and method for effectively controlling a bias voltage of a power amplifier.

Another aspect of the present disclosure is to provide an apparatus and method for controlling a linear regulator and a switching regulator according to a characteristic of a Radio Frequency (RF) transmission signal in a power modulator consisting of the linear regulator and the switching regulator.

Another aspect of the present disclosure is to provide an apparatus and method for changing a parameter of a power modulator which supplies a bias voltage of an RF amplifier according to a corresponding communication scheme, in a transmitting apparatus which uses one RF amplifier supporting at least two communication schemes.

In accordance with an aspect of the present disclosure, an electronic device is provided. The electronic device includes a baseband signal processor configured to convert a baseband signal to an envelope signal, a power amplifier configured to amplify an RF signal based on the baseband signal, a power modulator configured to modulate an input voltage to a bias voltage of the power amplifier based on the envelope signal, and a power controller configured to control an operation of the power modulator according to a characteristic of the baseband signal.

In accordance with another aspect of the present disclosure, an electronic device is provided. The electronic device includes a baseband signal processor configured to support at least one communication scheme and to separate a baseband signal into an amplitude component and a phase component, a power amplifier configured to amplify an RF signal based on the baseband signal, a power modulator configured to modulate an input voltage to a bias voltage of the power amplifier based on the amplitude component, and a power controller configured to control an operational parameter of the power modulator based on the communication scheme.

In accordance with another aspect of the present disclosure, a method of controlling an electronic device is provided. The method includes converting a baseband signal to an envelope signal, amplifying an RF signal based on the baseband signal, modulating an input voltage to a bias voltage of a power amplifier based on the envelope signal, and controlling the voltage modulation according to a characteristic of the baseband signal.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 5A, 5B, 5C, and 5D are graphs illustrating a result of envelope tracking for a low-band signal and a broadband signal according to various embodiments of the present disclosure;

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions or constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Hereinafter, a power amplifying apparatus and method will be described according to various embodiments of the present disclosure.

Figure 1A:
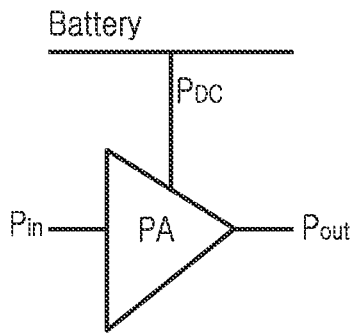
FIGS. 1A and 1B are block diagrams of a power amplifier according to various embodiments of the present disclosure.
Figure 1B:
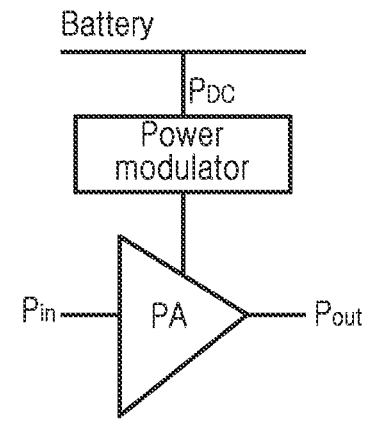

FIGS. 1A and 1B are block diagrams of a power amplifier according to various embodiments of the present disclosure.

FIG. 1A illustrates a structure of a typical Power Amplifier (PA). The typical PA may be supplied with a fixed bias voltage from a battery, amplify an input power Pin, and output a power Pout.

FIG. 1B illustrates a PA having an Envelope Tracking (ET) structure. The PA having the ET structure may include a power modulator which modulates a battery voltage according to an envelope signal and which provides a bias voltage to the PA.

Figure 1C:
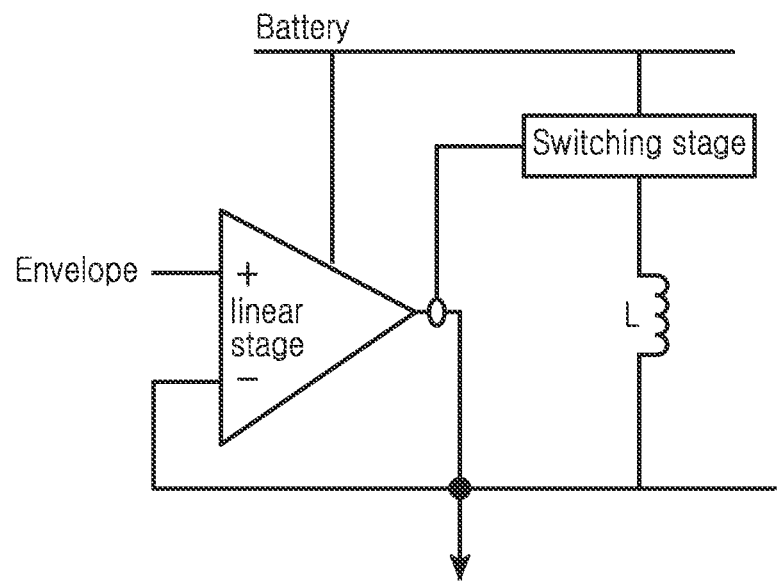
FIG. 1C is a block diagram of a power modulator of FIG. 1B according to an embodiment of the present disclosure.

FIG. 1C is a block diagram of a power modulator of FIG. 1B according to an embodiment of the present disclosure.

In various embodiments, the power modulator may be a hybrid-type power modulator constructed of a linear stage and a switching stage as shown in FIG. 1C. For example, in one embodiment, an output signal of a switching regulator may be smoothed by passing through an inductor L. A linear regulator may supply an additional current to the switching regulator if an output current of the switching regulator is less than a current required by the RF PA, and may absorb a surplus current from the output current of the switching regulator if the output current of the switching regulator is greater than the current required by the RF PA. The switching regulator of the power modulator may have a structure of a buck converter. However, in the various embodiments of the present disclosure, the switching regulator is not limited to the buck converter, and thus may be constructed of another Direct Current (DC)-DC converter, such as, a boost converter, a buck-boost converter, a cuk converter, etc.

Figure 2A:
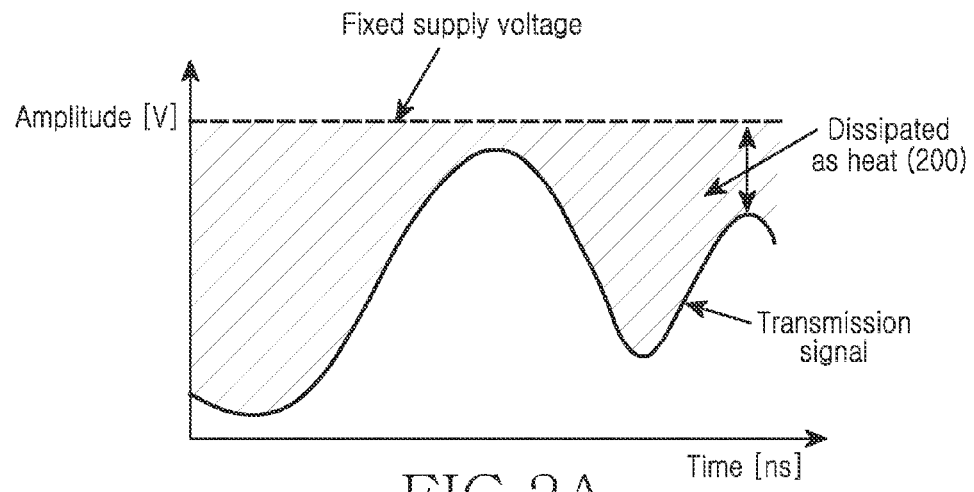
FIGS. 2A and 2B illustrate a bias voltage of a power amplifier and a waveform of a transmission signal according to various embodiments of the present disclosure.
Figure 2B:
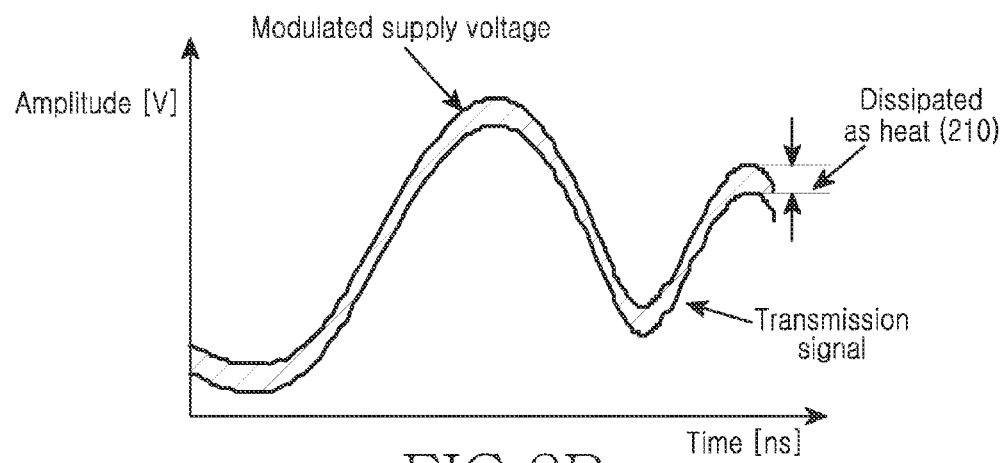

FIGS. 2A and 2B illustrate a bias voltage of a PA and a waveform of a transmission signal according to various embodiments of the present disclosure.

FIG. 2A illustrates an output waveform for a PA supplied with a fixed bias voltage as shown in FIG. 1A. FIG. 2B illustrates an output waveform for a PA supplied with a bias voltage modulated according to an envelope as shown in FIG. 1B.

As illustrated, a power loss 210 of a PA having an ET structure is less than a power loss 200 caused by the PA supplied with the fixed bias voltage.

However, in the PA having the ET structure, the power loss caused by the PA may be decreased in an area where an output power is a high-power level (e.g., in a case where an amplitude of a transmission signal output voltage of the PA is high). In addition, the power loss caused by the PA may be increased in an area where the output voltage of the PA is a low-power level (e.g., in a case where the amplitude of the transmission signal output voltage of the PA is low). A gain can be acquired according to an ET technique. FIG. 1C illustrates a hybrid power modulator used in the ET structure.

Figure 3A:
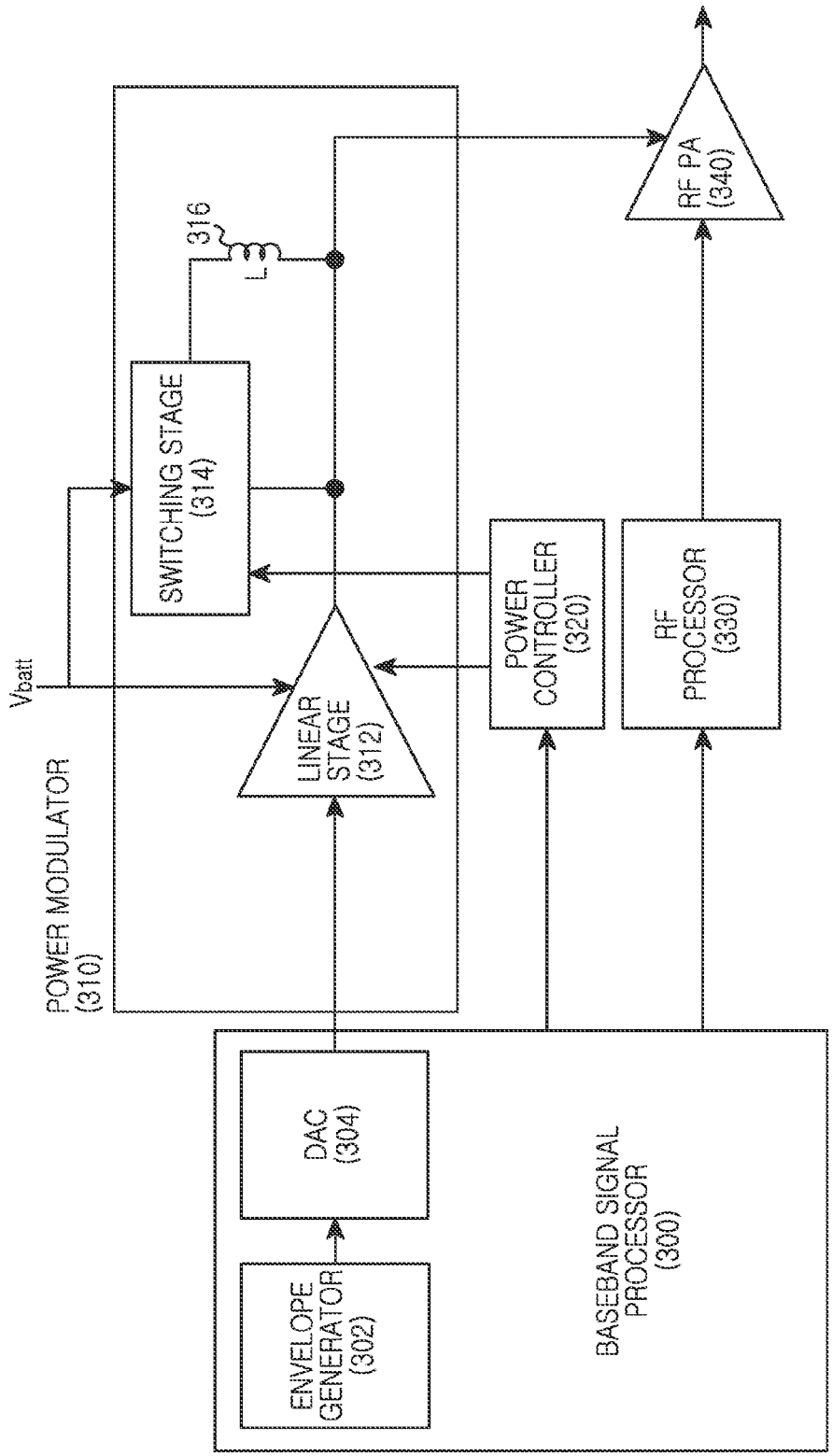
FIGS. 3A and 3B are block diagrams of a transmission apparatus having a hybrid structure according to various embodiments of the present disclosure.
Figure 3B:
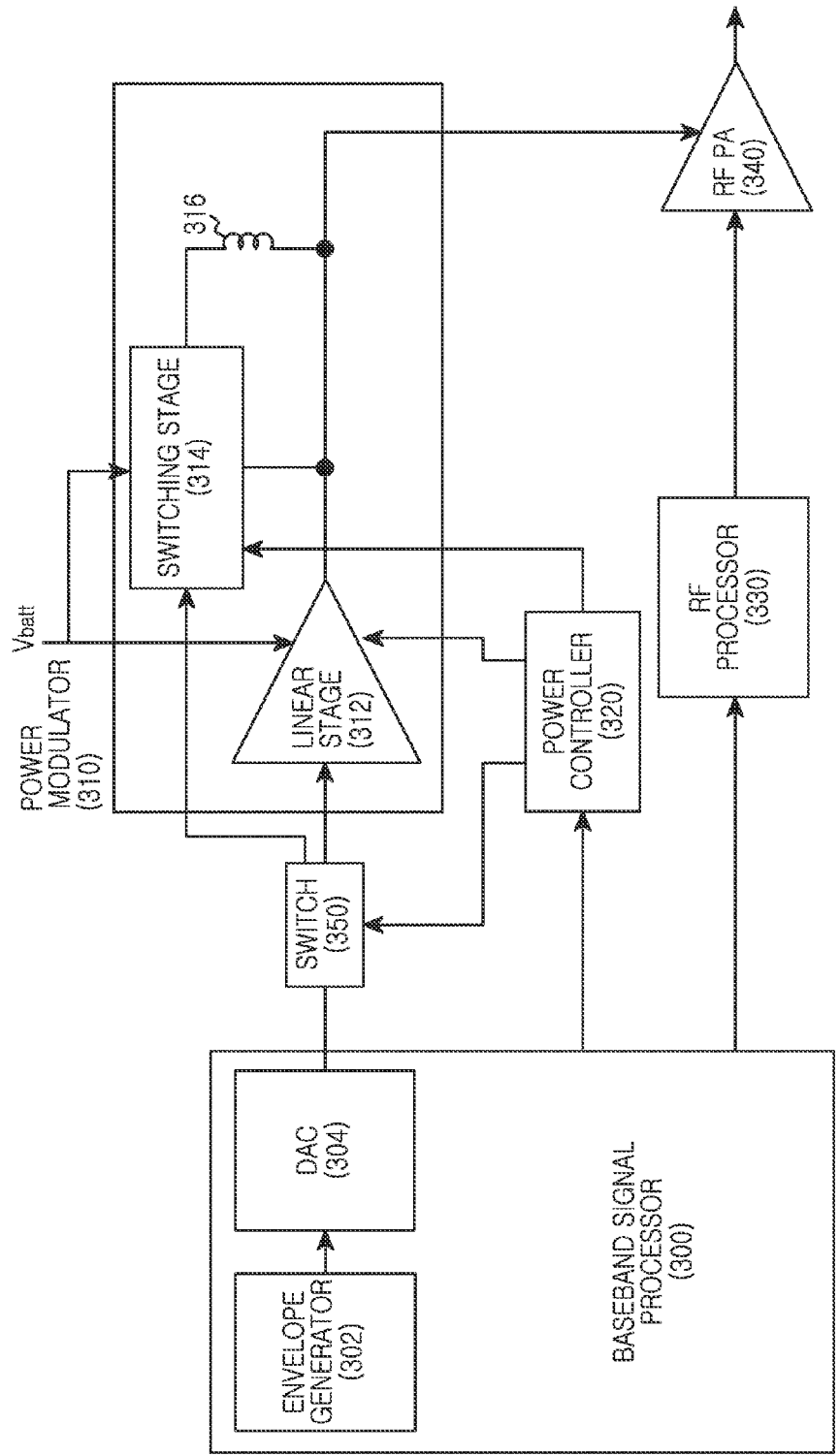

FIGS. 3A and 3B are block diagrams of a transmission apparatus having a hybrid structure according to various embodiments of the present disclosure.

Referring to FIG. 3A, the transmitting apparatus having the hybrid structure may include a baseband signal processor 300, a power modulator 310, a power controller 320, an RF processor 330, and an RF PA 340.

The baseband signal processor 300 may process a baseband signal according to a corresponding communication scheme (e.g., Orthogonal Frequency-Division Multiplexing (OFDM)/Orthogonal Frequency-Division Multiple Access (OFDMA) communication scheme, a Global System for Mobile communications (GSM) communication scheme, a Code Division Multiple Access (CDMA) communication scheme) and then output the baseband signal to the RF processor 330. Further, the baseband signal processor 300 may include an envelope generator 302 and a Digital Analog Converter (DAC) 304. The envelope generator 302 may detect an envelope signal from the baseband signal, convert the envelope signal detected from the envelope generator 302 into an analog signal, and output the signal to the power modulator 310. In the various embodiments, the envelope generator 302 may be constructed of a separate functional block. For example, the envelope generator 302 may be connected between the baseband signal processor 300 and the power modulator 310.

In the various embodiments, an output signal of the DAC 304 may be sent as an input of a switching stage 314 via a linear stage 312. In addition, in another embodiment, the output signal of the DAC 304 may be selectively sent as the input of the linear stage 312 or the switching stage 314 under the control of the power controller 320. In other words, the output signal of the DAC 304 may be directly sent as the input of the switching stage 314.

In other various embodiments, instead of using the DAC 304, the baseband signal processor 300 may output a Pulse Width Modulation (PWM) signal to the linear stage 312 or switching stage 314 of the power modulator 310. The RF processor 330 may convert a baseband signal into an RF signal and output the signal to the RF PA 340.

The power modulator 310 may modulate a DC power (e.g., a battery power) to provide a bias voltage to the RF PA 340, according to an envelope provided from the baseband signal processor 300. The power modulator 310 may be constructed of the linear stage 312 and the switching stage 314. For example, the linear stage and the switching stage may be a linear regulator and a switching regulator, respectively. An output signal of the switching regulator 314 may be smoothed by passing through an inductor L 316. The linear regulator 312 may supply an additional current to the switching regulator 314 if an output current of the switching regulator 314 is less than a current required by the RF PA 340, and may absorb a surplus current from the output current of the switching regulator 314 if the output current of the switching regulator 314 is greater than the current required by the RF PA 340. The switching regulator 314 of the power modulator 310 may have a structure of a buck converter. However, in the various embodiments of the present disclosure, the switching regulator is not limited to the buck converter, and thus may be constructed of another DC-DC converter, such as, a boost converter, a buck-boost converter, a cuk converter, etc.

According to various embodiments, the power controller 320 may determine whether a signal processed by the baseband signal processor 300 is a low-band signal, and if the processed signal is determined as the low-band signal, may control the linear regulator 312 to bypass an envelope signal from the baseband signal processor 300 to the switching regulator 314. Otherwise, if the processed signal is determined as a broadband signal, the linear regulator 312 and the switching regulator 314 may operate simultaneously. According to one embodiment, if a signal processed by the baseband signal processor 300 is the low-band signal (e.g., if a bandwidth of a transmission signal is less than a reference value), the power controller 320 may operate only the switching regulator 314 constructed of the buck converter of the power modulator 310 so that only the switching regulator 314 is used to supply a bias current or voltage to the RF PA 340. In the following description, bypassing of the envelope signal may imply that an input envelope signal is directly output.

On the other hand, if the signal processed by the baseband signal processor 300 is the broadband signal (e.g., if the bandwidth of the transmission signal is greater than the reference signal), the power controller 320 may operate the linear regulator 312 and the switching regulator 314 simultaneously so as to supply a bias current or voltage to the RF PA 340.

According to various embodiments, if the signal processed by the baseband signal processor 300 is an audio signal such as Voice over Long Term Evolution (VoLTE), the power controller 320 may operate only the switching regulator 314 constructed of the buck converter of the power modulator 310 so that only the switching regulator 314 is used to supply a bias current or voltage to the RF PA 340. Otherwise, if the signal processed by the baseband signal processor 300 is not the audio signal such as VoLTE, the power controller 320 may operate the linear regulator 312 and the switching regulator 314 simultaneously so as to supply a bias current or voltage to the RF PA 340.

According to other various embodiments, if a small-sized Resource Block (RB) is allocated according to a channel environment by a base station scheduler or if an allocated resource corresponds to a fixed small data throughput, the power controller 320 may operate only the switching regulator 314 constructed of the buck converter of the power modulator 310 so that only the switching regulator 314 is used to supply a bias current or voltage to the RF PA 340. Otherwise, if the RB allocated according to the base station scheduler has a size greater than the reference value or the allocated resource has a data throughput greater than the fixed reference data throughput, the power controller 320 may operate the linear regulator 312 and the switching regulator 314 simultaneously so as to supply a bias current or voltage to the RF PA 340. Herein, the RB is a basic unit of resource allocation of an LTE system.

According to another embodiment, even if the transmission signal is the broadband signal, when a battery power is not sufficient (e.g., when a battery voltage is low), only the switching regulator 314 constructed of the buck switch may be used to control the bias voltage or current of the RF PA 340.

According to another embodiment, in a state where an output voltage of the switching regulator 314 is higher by a specific level than an output voltage of the linear regulator 312, if the switching regulator 314 cannot track the output voltage, the output voltage may be tracked by the linear regulator 312.

The RF PA 340 may amplify an RF signal according to the bias voltage provided by the power modulator 310 and output the amplified RF signal to an antenna (not shown).

According to another embodiment, although not shown, if only the switching regulator 314 operates, the power modulator 310 may need to reduce a switching noise which may be generated inside the switching regulator 314 or may need to maintain a constant voltage even if a current greater than a threshold flows instantaneously to a load. For this, a capacitor may be added to an output stage of the power modulator 310. When the linear regulator 312 and the switching regulator 314 operate simultaneously, the linear regulator 312 may take a role of the capacitor.

Referring to FIG. 3B, the transmitting apparatus having the hybrid structure may include a baseband signal processor 300, a power modulator 310, a power controller 320, a RF processor 330, a RF PA 340, and a switch 350.

The baseband signal processor 300, the power modulator 310, the power controller 320, the RF processor 330, and the RF PA 340 may operate in the same manner as shown in FIG. 3A. However, if the signal processed by the baseband signal processor 300 is a low-band signal or the signal processed by the baseband signal processor 300 is an audio signal such as VoLTE or if a small-sized RB is allocated according to a base station scheduler or the allocated resource corresponds to a fixed small data throughput, the power controller 320 may control the switch 350 so that the envelope signal of the baseband signal processor 300 is provided to the switching regulator 314.

Otherwise, if the signal processed by the baseband signal processor 300 is not the low-band signal or is not the audio signal such as VoLTE, or if the RB allocated according to the base station scheduler has a size greater than the reference value or the allocated resource corresponds to a data throughput greater than the fixed reference data throughput, the power controller 320 may control the switch 350 so that the envelope signal of the baseband signal processor 300 is provided to the linear regulator 312.

As described above, the bias voltage can be reliably supplied to the RF PA 340 by using only the buck converter in the low-band transmission signal of the PA structure of FIGS. 3A and 3B. Therefore, when the low-band transmission signal is processed, power consumption can be more optimized by operating the high-efficiency buck converter.

In various embodiments, an envelope shaping function may be further performed in the baseband signal processor 300.

Figure 4:
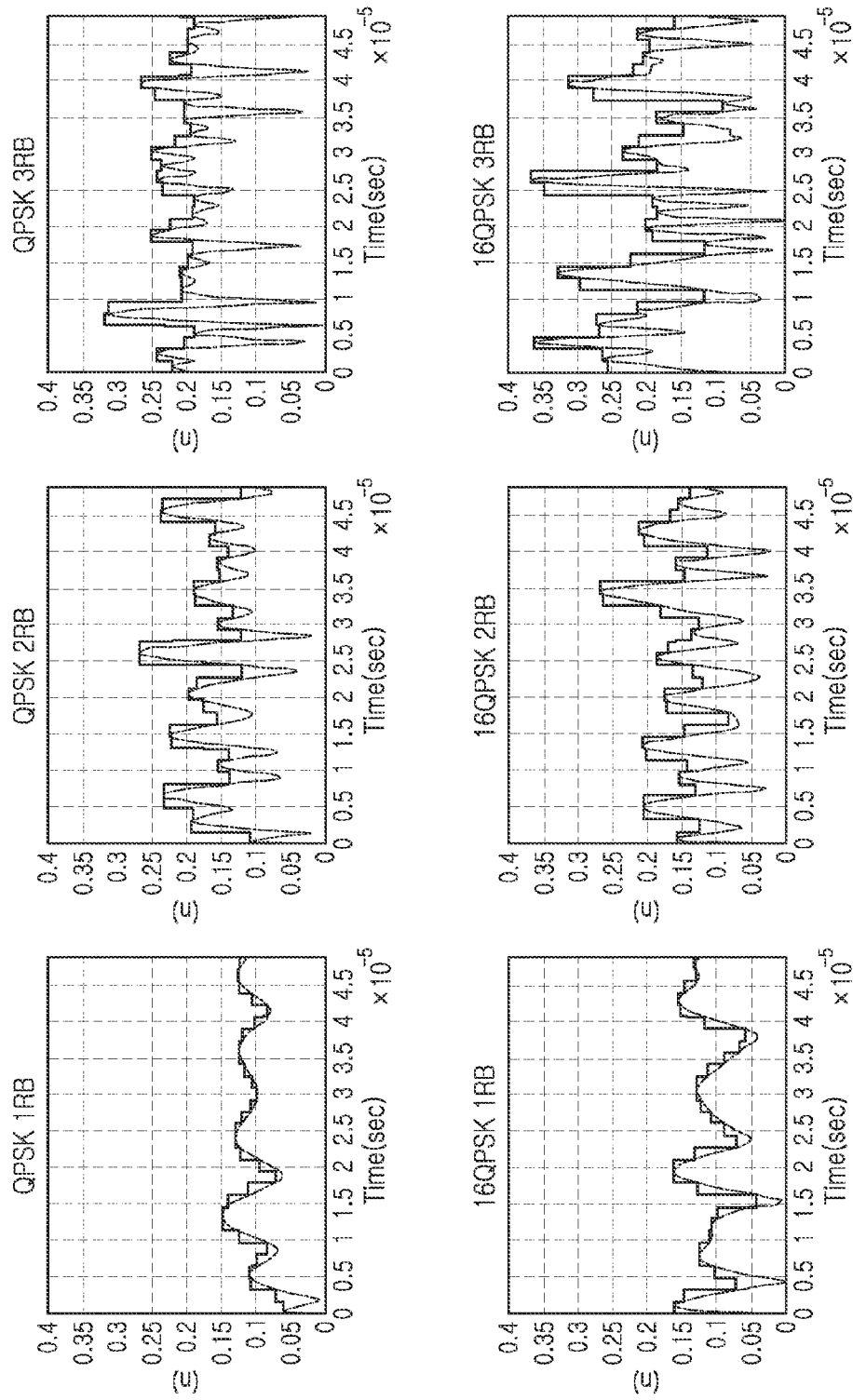
FIG. 4 illustrates an envelope signal not subjected to envelope shaping and an envelope signal subjected to envelope shaping according to an embodiment of the present disclosure.

FIG. 4 illustrates an envelope signal not subjected to envelope shaping and an envelope signal subjected to envelope shaping according to an embodiment of the present disclosure.

Referring to FIG. 4, a typical envelope signal based on the number of allocated RBs and a modulation scheme (e.g., Quadrature Phase Shift Keying (QPSK), Quadrature Amplitude Modulation (QAM)) is compared with the envelope signal subjected to the envelope shaping (e.g., an envelope signal on which an envelope shaping function is performed).

If the signal is a low-band signal or an audio signal such as VoLTE or if a data throughput is less than a threshold, only the switching regulator 314 may be used to track the envelope signal. Graphs of FIGS. 5A to 5D described below show a result of envelope tracking performed by the switching regulator 314 on each of a low-band signal and a broadband signal.

FIGS. 5A to 5D illustrate examples of envelope tracking based on a bandwidth according to various embodiments of the present disclosure.

FIG. 5A illustrates an envelope signal of 100 Hz. When the envelope signal of FIG. 5A is input to the switching regulator 314 of FIGS. 3A and 3B, an output signal corresponding to the envelope signal of 100 Hz may be output as illustrated in FIG. 5B. In this case, the output signal may be similar in shape with the input signal.

FIG. 5C illustrates an envelope signal of 1 kHz. When the envelope signal of FIG. 5C is input to the switching regulator 314 of FIGS. 3A and 3B, an output signal corresponding to the envelope signal of 1 kHz may be output as illustrated in FIG. 5D. In this case, the output signal may be similar in shape with the input signal.

As described above, in case of a low-band envelope signal, the envelope signal can be sufficiently tracked by using only the switching regulator 314. However, in case of a high-band envelope signal, the envelope signal cannot be sufficiently tracked when using only the switching regulator 314.

Although 100 Hz and 1 kHz are exemplified respectively for the low band and the high band in FIGS. 5A to 5D, a threshold for determining whether a band is the low band may be determined variously according to a buck converter structure.

Figure 6:
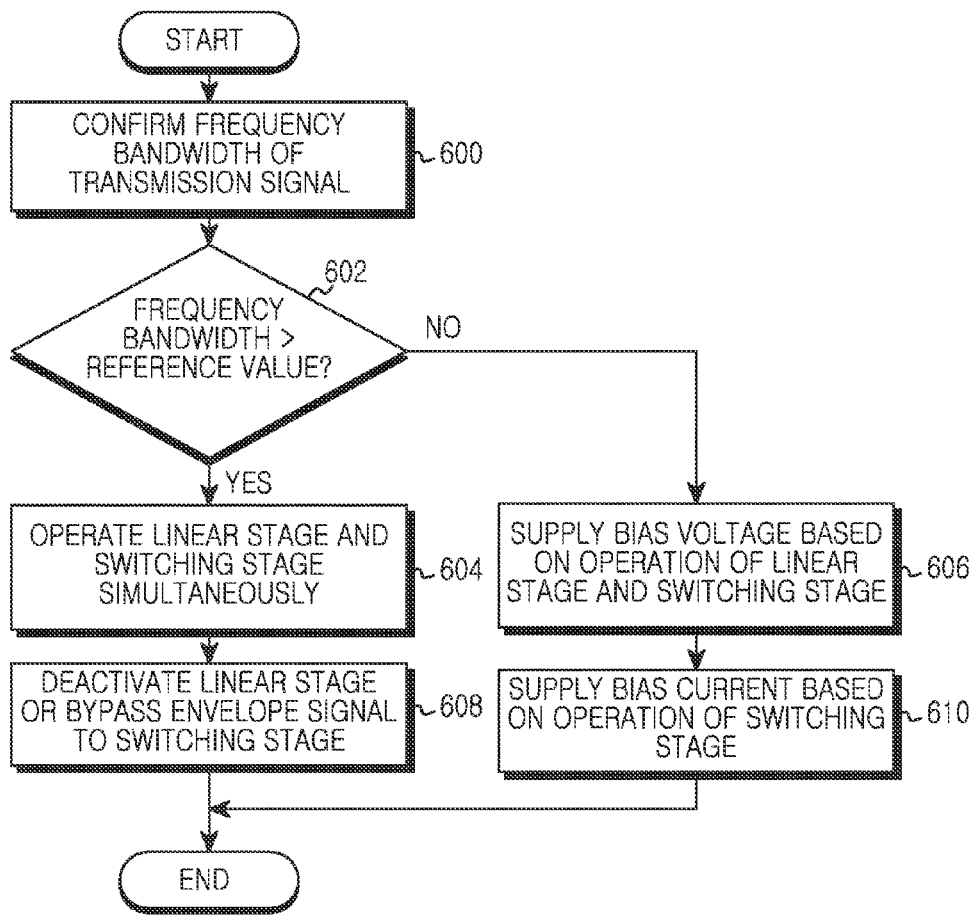
FIG. 6 is a flowchart illustrating a process of controlling a linear regulator and switching regulator of a power modulator based on a frequency bandwidth of a transmission signal according to an embodiment of the present disclosure.

FIG. 6 is a flowchart illustrating a process of controlling a linear regulator and switching regulator of a power modulator based on a frequency bandwidth of a transmission signal according to an embodiment of the present disclosure.

Referring to FIG. 6, in operation 600, the power controller 320 may determine whether a signal processed by the baseband signal processor 300 is a low-band signal. For example, the power controller 320 may confirm a bandwidth of a baseband signal based on a spectrum of the signal processed by the baseband signal processor 300. The baseband signal processor 300 may know a frequency band of a transmission signal by using resource allocation information regarding the transmission signal included in a downlink control information signal transmitted by a base station.

If it is determined in operation 602 that the band of the transmission signal is greater than the reference value, proceeding to operation 604, the power controller 320 may operate the linear regulator 312 and the switching regulator 314. In operation 608, the power modulator 310 may provide the PA 340 with a bias voltage or current in which a battery voltage is modulated by the operation of the linear regulator 312 and the switching regulator 314.

If the band of the transmission signal is less than the reference signal, proceeding to operation 606, only the switching regulator 314 of the power modulator 310 may be deactivated or the linear regulator 412 may be configured to bypass an envelope signal of the baseband signal processor 300 to the switching regulator 314. In operation 610, the power modulator 310 may provide the power amplifier 340 with the bias voltage or current in which the battery voltage is modulated by the operation of the switching regulator 314.

Figure 7:
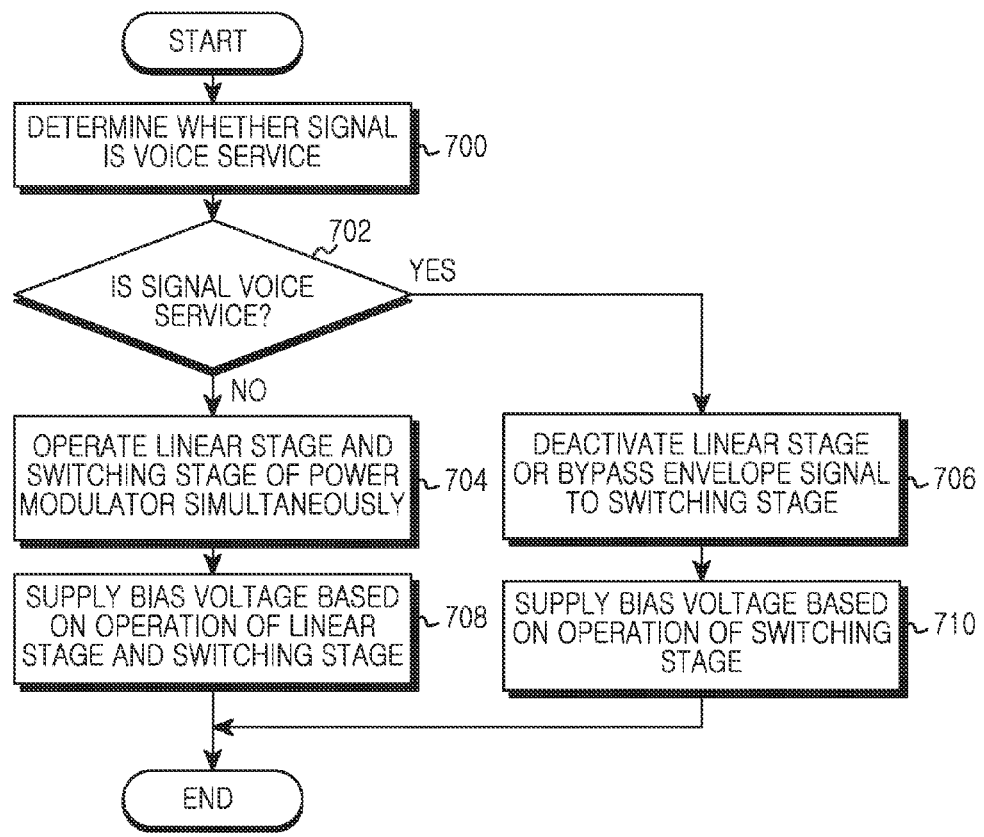
FIG. 7 is a flowchart illustrating a process of controlling a liner regulator and switching regulator of a power modulator based on a communication service type according to an embodiment of the present disclosure.

FIG. 7 is a flowchart illustrating a process of controlling a liner regulator and switching regulator of a power modulator based on a communication service type according to an embodiment of the present disclosure.

Referring to FIG. 7, in operation 700, the power controller 320 may recognize or determine an audio signal (e.g., VoLTE) by receiving a control signal transmitted from the baseband signal processor 300. For example, the baseband signal processor 300 may know whether to transmit an audio signal such as VoLTE by analyzing a downlink control information signal transmitted from a base station, or may know whether to transmit an audio signal such as VoLTE by recognizing audio data or a control signal transmitted from an audio-related hardware entity (e.g., an audio codec or a microphone).

According to various embodiments, if it is determined in operation 702 that the signal processed in the baseband signal processor 300 is not the audio signal such as VoLTE, proceeding to operation 704, the power controller 320 may operate the linear regulator 312 and switching regulator 314 of the power modulator 310. In operation 708, the power modulator 310 may provide the power amplifier 340 with a bias voltage or current in which a battery voltage is modulated by the operation of the linear regulator 312 and the switching regulator 314.

In case of the audio signal such as VoLTE, in operation 706, only the switching regulator 314 of the power modulator 310 may be deactivated or the linear regulator 412 may be configured to bypass an envelope signal of the baseband signal processor 300 to the switching regulator 314. In operation 710, the power modulator 310 may provide the power amplifier 340 with the bias voltage or current in which the battery voltage is modulated by the operation of the switching regulator 314.

Figure 8:
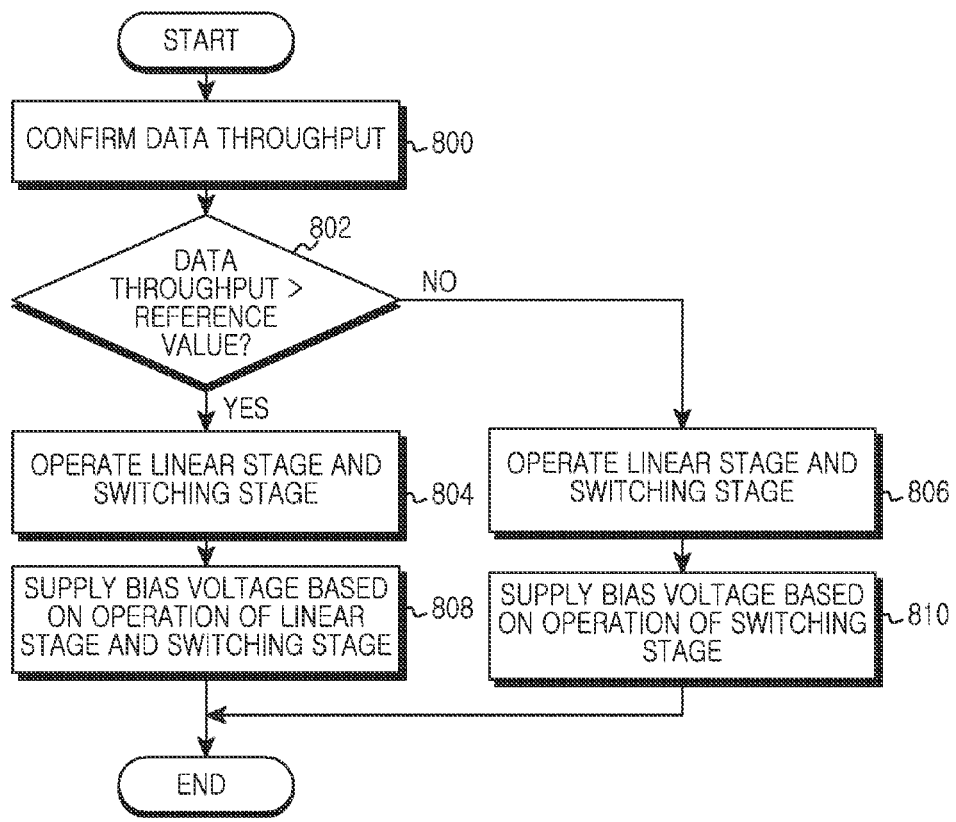
FIG. 8 is a flowchart illustrating a process of controlling a liner regulator and switching regulator of a power modulator based on data transmission according to an embodiment of the present disclosure.

FIG. 8 is a flowchart illustrating a process of controlling a liner regulator and switching regulator of a power modulator based on data transmission according to an embodiment of the present disclosure.

Referring to FIG. 8, in operation 800, the power controller 320 may recognize or determine a data throughput of a transmission signal by receiving signaling transmitted from the baseband signal processor 300. For example, the baseband signal processor 300 may know the data throughput of the transmission signal by using resource allocation information regarding the transmission signal included in a downlink control information signal transmitted from a base station.

If it is determined in operation 802 that the data throughput of the transmission signal is greater than a reference value, proceeding to operation 804, the power controller 320 may operate the linear regulator 312 and switching regulator 314 of the power modulator 310. In operation 808, the power modulator 310 may provide the power amplifier 340 with a bias voltage or current in which a battery voltage is modulated by the operation of the linear regulator 312 and the switching regulator 314.

Otherwise, if the data throughput of the transmission signal is less than the reference value, proceeding to operation 806, only the switching regulator 314 of the power modulator 310 may be deactivated or the linear regulator 312 may be configured to bypass an envelope signal of the baseband signal processor 300 to the switching regulator 314. In operation 810, the power modulator 310 may provide the power amplifier 340 with the bias voltage or current in which the battery voltage is modulated by the operation of the switching regulator 314.

Figure 9:
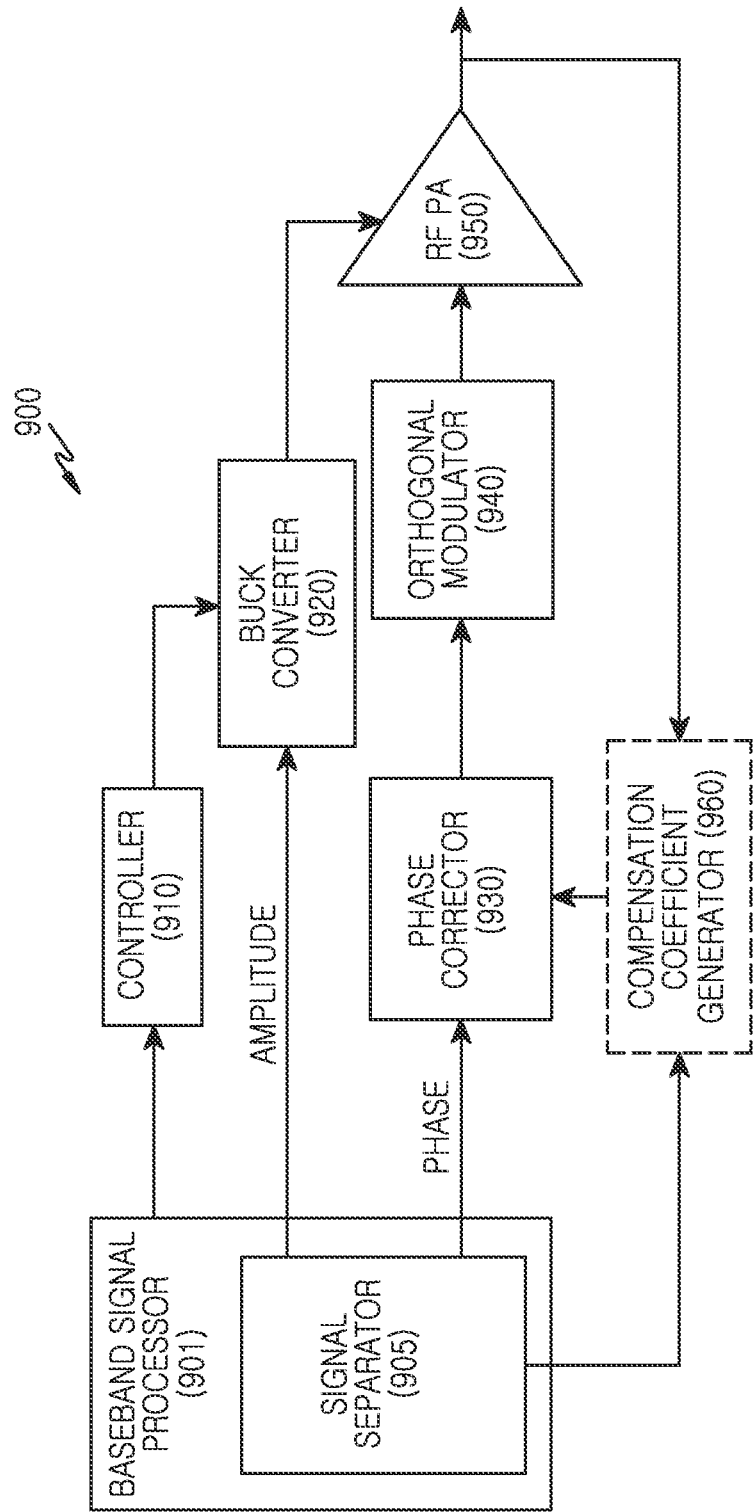
FIG. 9 is a block diagram of a transmitting apparatus having an Envelope Elimination Restoration (EER) structure according to an embodiment of the present disclosure.

FIG. 9 is a block diagram of a transmitting apparatus having an Envelope Elimination Restoration (EER) structure according to an embodiment of the present disclosure.

The transmitting apparatus having the EER structure may amplify an RF signal including only phase information in which amplitude information is excluded, and thus may perform high-efficiency amplification by reducing a distortion of an amplifier itself. In this case, the amplifier may restore amplitude information of the amplified RF signal by using the amplitude component as an output bias voltage of the amplifier.

Referring to FIG. 9, a transmitting apparatus 900 may include a baseband signal processor 901, a controller 910, a buck converter 920, a phase corrector 930, an orthogonal modulator 940, and an RF PA 950.

According to various embodiments, the baseband signal processor 900 may output a signal by separating an amplitude component and a phase component from the signal to be transmitted via the EER power transmitter.

According to one embodiment, the baseband signal processor 900 may transmit the amplitude component to the buck converter 920, and may output the phase component to the phase corrector 930. For example, the amplitude-component signal may be an envelope signal.

According to one embodiment, a signal separator 905 of the baseband signal processor 900 may separate amplitude information and phase information from a baseband region by using a Coordinate Rotation Digital Computer (CORDIC) algorithm that can be implemented with a Digital Signal Processor (DSP).

Such a structure of the transmitting apparatus may simultaneously support a GSM communication scheme and an LTE communication scheme. For example, the transmitting apparatus may be designed to have a shared structure with a GSM polar transmitter.

According to one embodiment, the buck converter 920 may modulate a battery voltage based on the amplitude-component signal or the envelope signal and thus may supply a bias voltage to the RF PA 950.

According to one embodiment, the phase corrector 930 may output a signal by correcting a phase component so that a linearity of the phase component can be maintained as to the phase-component signal provided from the baseband signal processor 900, for example, based on an open loop scheme.

According to one embodiment, the orthogonal modulator 940 may output a signal by modulating the phase-component signal, which is corrected by the phase corrector 930 based on a carrier having a higher frequency than an original signal, to a high-frequency signal.

According to one embodiment, the controller 910 may determine whether a transmission signal is a signal of the LTE communication scheme or a signal of the GSM communication scheme in an area where the GSM communication scheme and the LTE communication scheme coexist, and thus change a parameter of the buck converter 920. For example, the controller 910 may change an operational characteristic of an internal block constituting the buck converter 920 according to a type of the transmission signal. In addition, the controller 910 may control an envelope shaping function described above with reference to FIG. 4 according to the characteristic of the transmission signal. For example, the controller 910 may deactivate the envelope shaping function that can be performed in the baseband signal processor 900 in case of the signal of the GSM communication scheme, and may activate the envelope shaping function that can be performed in the baseband signal processor 900 in case of the signal of the LTE communication scheme.

According to one embodiment, the RF PA 950 may output a signal to an antenna by amplifying a high-frequency signal provided from the orthogonal modulator 940 by the use of a bias voltage or current provided from the buck converter 920. For example, the RF PA 950 may restore an amplitude component of the signal to be transmitted when the baseband signal processor 900 supplies a bias voltage by using the amplitude component.

It is described above that, as shown in the transmitting apparatus 900 having the EER structure, the efficiency and linearity of the power transmitter can be both satisfied since a phase component and an amplitude component are separated from a transmission signal and then the signal is amplified.

In various embodiments, a compensation coefficient generator 960 may be added to the transmitting apparatus 900.

The compensation coefficient generator 960 may generate a phase compensation coefficient and an amplitude compensation coefficient by using a phase-component signal of the signal separator 905 and an output signal of the RF PA 950. That is, the compensation coefficient generator 960 may confirm information on a phase distortion caused by the RF PA 950 and may generate a phase compensation coefficient and an amplitude compensation coefficient to perform digital predistortion on a transmission signal. For example, the compensation coefficient generator 960 may confirm an amplitude and phase characteristic of the RF PA 950 by using an input signal of the signal separator 905 and an output signal of the RF PA 950. In addition, the compensation coefficient generator 960 may generate the amplitude compensation coefficient by using the amplitude and phase characteristic of the RF PA 950, and thereafter may generate the phase compensation coefficient by extracting a phase component value based on the amplitude component.

According to one embodiment, the RF PA 950 may repetitively generate the amplitude compensation coefficient and the phase compensation coefficient so that an error value of the generated amplitude compensation coefficient and phase compensation coefficient is minimized.

According to one embodiment, the compensation coefficient generator 960 may generate the compensation coefficient by using an index (i.e., Look Up Table (LUT)) expressed by a table or by using a polynomial.

The controller 910 may change a parameter of the buck converter 920 by determining whether the transmission signal is a signal of an LTE communication scheme or a signal of a GSM communication scheme in an area where the GSM communication scheme and the LTE communication system co-exist. For example, the controller 910 may change a switching frequency (see FIG. 10) of the buck converter 920 according to a type of the transmission signal.

In addition, the controller 910 may control the envelope shaping function described above with reference to FIG. 4 according to the characteristic of the transmission signal. For example, the controller 910 may deactivate the envelope shaping function that can be performed in the baseband signal processor 900 in case of the signal of the GSM communication scheme, and may activate the envelope shaping function that can be performed in the baseband signal processor 900 in case of the signal of the LTE communication scheme.

As described above, the transmitting apparatus 900 having the EER structure may compensate for a linearity for each of an amplitude component and a phase component to correct a phase distortion caused by a DC voltage of a high-efficiency amplifier. In this case, the EER transmitting apparatus 900 may compensate for only the linearity of the phase component to correct the phase distortion caused by the DC voltage of the high-efficiency amplifier.

Figure 10:
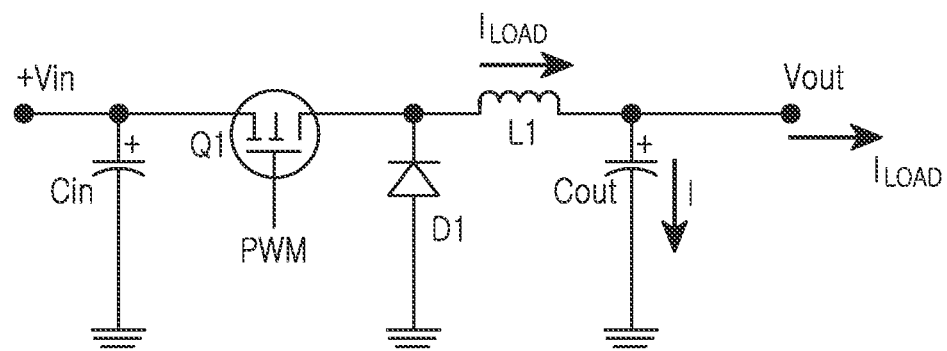
FIG. 10 illustrates a structure of a buck converter according to an embodiment of the present disclosure.

FIG. 10 illustrates a structure of a buck converter according to an embodiment of the present disclosure.

Referring to FIG. 10, a power voltage Vin may be supplied to a drain of an N-MOSFET Q1. When a Pulse Width Modulation (PWM) waveform is in a High duration, the N-MOSFET Q1 becomes an ON state, and thus a current can flow from the drain to a source via a gate. In the various embodiments of the present disclosure, a switching frequency may be changed by adjusting a pulse width of the PWM waveform in consideration of a frequency characteristic of an input signal of a buck converter.

The power supplied via the source of the N-MOSFET Q1 may be a high-frequency signal since it is a power signal which flows on a high-level signal at the gate. When such a signal of a high-frequency component passes through a Low Pass Filter (LPF) consisting of an inductor L1 and a capacitor Cout, the high-frequency component may be eliminated and an output voltage Vout may be output at a load.

If the inductor L1 and the capacitor Cout are fully charged during a time in which the N-MOSFET Q1 is ON, a low-level signal may be input as a gate signal of the N-MOSFET Q1. Then, an input power may be cut off and thus the M-MOSFET Q1 may be OFF. In this case, energy stored in the inductor L1 may start to be discharged, and instantaneously, a power may be continuously supplied to the load.

In this case, a diode D1 may be located between the N-MOSFET Q1 and the LPF consisting of the inductor L1 and the capacitor Cout, thereby forming a closed loop. When the energy of the inductor L1 is fully discharged to be decreased to a specific voltage, it may be detected through a feedback. Then, the gate becomes a High state again, the N-MOSFET Q1 is ON, and thus the power can be supplied. As described above, an output voltage lower than an input voltage may be generated by providing a PWM signal to the gate of the N-MOSFET Q1.

Figure 11:
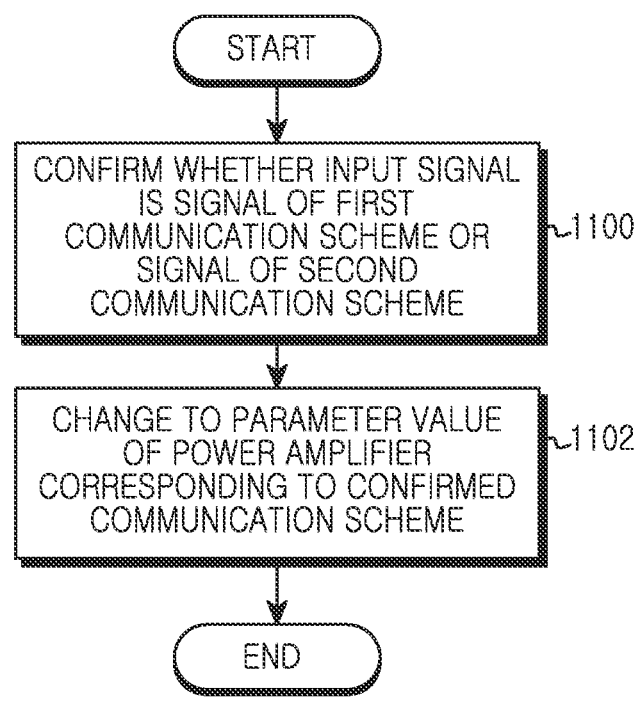
FIG. 11 is a flowchart illustrating a process of changing a parameter value of a power modulator in a transmitter supporting two or more transmission schemes according to an embodiment of the present disclosure.

FIG. 11 is a flowchart illustrating a process of changing a parameter value of a power modulator in a transmitter supporting two or more transmission schemes according to an embodiment of the present disclosure.

Referring to FIG. 11, the controller 910 may determine whether a transmission signal is a signal of the LTE communication scheme or a signal of the GSM communication scheme in an area where the GSM communication scheme and the LTE communication scheme coexist in operation 1100, and may change a parameter of the buck converter 920 in operation 1102. For example, the controller 910 may change a switching frequency of the buck converter 910 of FIG. 10 according to a type of the transmission signal. In addition, the controller 910 may control an envelope shaping function described according to the characteristic of the transmission signal. For example, the controller 910 may deactivate the envelope shaping function that can be performed in the baseband signal processor 900 in case of the signal of the GSM communication scheme, and may activate the envelope shaping function that can be performed in the baseband signal processor 900 in case of the signal of the LTE communication scheme.

An amplifier circuit may include a baseband signal processor configured to convert a baseband signal to an envelope signal, a switch configured to perform switching to provide the envelope signal to a linear stage or switching stage of a power modulator according to a switching control signal, a controller configured to control the switch by generating the switching control signal according to a characteristic of the baseband signal, a power modulator configured to provide a bias voltage to the power amplifier via the switching stage which deactivates the linear stage when the envelope signal is supplied to the switching stage of the power modulator and which absorbs a surplus current of the switching stage or supplies an under current when the envelope signal is provided to the linear stage of the power modulator, and an RF amplifier configured to amplify an RF signal according to a bias voltage of the power modulator.

A characteristic of the baseband signal may be determined according to a bandwidth of the baseband signal, a data throughput, or whether the baseband signal is a signal corresponding to a voice service.

As described above, according to a characteristic of a transmission signal which is input or output via a power amplifier, a power modulator decreases a loss of voltage which is supplied to the power amplifier. Therefore, a power supplied to the power amplifier via the power modulator from a battery can be decreased. In addition, since one power amplifier structure supporting two or more communication schemes is provided, there is no need to add an additional hardware entity.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a baseband signal processor configured to convert a baseband signal to an envelope signal;
a power amplifier configured to amplify a Radio Frequency (RF) signal based on the baseband signal;
a power modulator configured to modulate an input voltage to a bias voltage of the power amplifier based on the envelope signal, the power modulator comprising a linear regulator and a switching regulator; and
a power controller configured to:
selectively deactivate the linear regulator based on a characteristic of the baseband signal, and
selectively deactivate the baseband signal processor based on a communication scheme of the baseband signal.

2. The electronic device of claim 1, wherein the power controller is further configured to provide the envelope signal to either the switching regulator or both the linear regulator and the switching regulator based on at least one of a bandwidth of the baseband signal, a data throughput, and a type of a signal corresponding to a voice service of the baseband signal.

3. The electronic device of claim 2,
wherein if the bandwidth of the baseband signal is less than a reference signal, the power controller is further configured to control the linear regulator of the power modulator to bypass an envelope component of the baseband signal to the switching regulator of the power modulator, or to control a switch to deactivate the linear regulator and to provide the envelope component of the baseband signal to the switching regulator, and wherein if the bandwidth of the baseband signal is greater than the reference signal, the power controller is further configured to operate the linear regulator and the switching regulator.

4. The electronic device of claim 2,
wherein if the data throughput of the baseband signal is less than a reference value, the power controller is further configured to control the linear regulator of the power modulator to bypass an envelope component of the baseband signal to the switching regulator of the power modulator, or to control a switch to deactivate the linear regulator and to provide the envelope component of the baseband signal to the switching regulator, and
wherein if the data throughput of the baseband signal is greater than the reference signal, the power controller is further configured to operate the linear regulator of the power modulator and the switching regulator of the power modulator.

5. The electronic device of claim 2,
wherein if the baseband signal is a signal corresponding to a voice service, the power controller is further configured to control the linear regulator of the power modulator to bypass an envelope component of the baseband signal to the switching regulator of the power modulator, or to control a switch to deactivate the linear regulator and to provide the envelope component of the baseband signal to the switching regulator, and
wherein if the baseband signal is a signal corresponding to a data service, the power controller is further configured to operate the linear regulator and the switching regulator.

6. The electronic device of claim 1,
wherein the switching regulator of the power modulator includes at least one of a buck converter, a boost converter, a buck-boost converter, and a cuk converter, and
wherein the power modulator modulates the battery voltage to a bias voltage of the power amplifier according to an envelope component of the baseband signal.

7. The electronic device of claim 1, further comprising an RF processor configured to convert the baseband signal to an RF signal.

8. An electronic device comprising:
a baseband signal processor configured to support at least one communication scheme and to separate a baseband signal into an amplitude component and a phase component;
a power amplifier configured to amplify a Radio Frequency (RF) signal based on the baseband signal;
a power modulator configured to modulate an input voltage to a bias voltage of the power amplifier based on the amplitude component; and
a power controller configured to control operational parameters of the power modulator based on the communication scheme,
wherein the operational parameters of the power modulator include a switching frequency function and an envelope shaping function, and
wherein the power controller is further configured to:
selectively deactivate the linear regulator based on a characteristic of the baseband signal, and
selectively deactivate the baseband signal processor based on a communication scheme of the baseband signal.

9. The electronic device of claim 8, wherein the communication scheme is at least one of Global System for Mobile communications (GSM), Long Term Evolution (LTE), Code Division Multiple Access (CDMA), Wi-Fi, Bluetooth, and Wideband Code Division Multiple Access (WCDMA).

10. The electronic device of claim 8, further comprising:
a compensation coefficient generator configured to generate a compensation coefficient to compensate for a linearity of the amplitude component and the phase component, based on an input signal of the baseband signal processor and an output signal of the power amplifier; and
an orthogonal modulator configured to compensate for the linearity of the phase component based on the compensation coefficient and to modulate the phase component to a high-frequency signal,
wherein the power amplifier is configured to amplify the high-frequency signal when the bias voltage is input.

11. A method of controlling an electronic device, the method comprising:
converting, by a baseband signal processor, a baseband signal to an envelope signal;
amplifying, by a power amplifier, a Radio Frequency (RF) signal based on the baseband signal;
modulating, by a power modulator, an input voltage to a bias voltage of the power amplifier based on the envelope signal, the power modulator comprising a linear regulator and a switching regulator; and
controlling, by a power controller, the voltage modulation according to a characteristic of the baseband signal,
wherein the controlling of the voltage modulation includes:
selectively deactivating the linear regulator based on a characteristic of the baseband signal, and
selectively deactivating the baseband signal processor based on a communication scheme of the baseband signal.

12. The method of claim 11, wherein in the controlling of the voltage modulation, the envelope signal is provided to either the switching regulator scheme or both the linear regulator scheme and the switching regulator scheme based on at least one of a bandwidth of the baseband signal, a data throughput, and a type of a signal corresponding to a voice service of the baseband signal.

13. The method of claim 12, wherein the controlling of the voltage modulation comprises:
if the bandwidth of the baseband signal is less than a reference signal, controlling the linear regulator to bypass an envelope component of the baseband signal to the switching regulator, or controlling a switch to deactivate the linear regulator and to provide the envelope component of the baseband signal to the switching regulator; and
if the bandwidth of the baseband signal is greater than the reference signal, operating the linear regulator and the switching regulator.

14. The method of claim 12, wherein the controlling of the voltage modulation comprises:
if the data throughput of the baseband signal is less than a reference value, controlling the linear regulator to bypass an envelope component of the baseband signal to the switching regulator, or controlling a switch to deactivate the linear regulator and to provide the envelope component of the baseband signal to the switching regulator; and
if the data throughput of the baseband signal is greater than the reference signal, operating the linear regulator and the switching regulator.

15. The method of claim 12, wherein the controlling of the voltage modulation comprises:

if the baseband signal is a signal corresponding to a voice service, controlling the linear regulator to bypass an envelope component of the baseband signal to the switching regulator, or controlling a switch to deactivate the linear regulator and to provide the envelope component of the baseband signal to the switching regulator; and if the baseband signal is a signal corresponding to a data service, operating the linear regulator and the switching regulator.

16. The method of claim 11,
wherein the switching regulator of the power modulator includes at least one of a buck converter, a boost converter, a buck-boost converter, and a cuk converter, and
wherein the power modulator modulates the battery voltage to a bias voltage of the power amplifier according to an envelope component of the baseband signal.

17. An amplifier circuit comprising:
a baseband signal processor configured to convert a baseband signal to an envelope signal;
a switch configured to perform switching to provide the envelope signal to at least one of a linear stage of a power modulator and a switching stage of the power modulator according to a switching control signal;
a controller configured to:
  control the switch by generating the switching control signal according to a characteristic of the baseband signal, and
  activate either the switching stage or both the linear stage and the switching stage based on the control signal;
a power modulator configured to:
  provide a bias voltage to a Radio Frequency (RF) power amplifier via the switching stage,
  deactivate the linear stage when the envelope signal is supplied to the switching stage of the power modulator, and
  absorb a surplus current of the switching stage or supply an under current when the envelope signal is provided to the linear stage of the power modulator,
wherein the RF power amplifier is configured to amplify an RF signal according to a bias voltage of the power modulator, and
wherein the controller is further configured to selectively deactivate the baseband signal processor based on a communication scheme of the baseband signal.

18. The amplifier circuit of claim 17, wherein the characteristic of the baseband signal is determined according to at least one of a bandwidth of the baseband signal, a data throughput, and whether the baseband signal is a signal corresponding to a voice service.

* * * * *